United States Patent
Miyajima

(10) Patent No.: US 9,024,390 B2
(45) Date of Patent: May 5, 2015

(54) SEMICONDUCTOR DEVICE

(71) Applicant: Panasonic Corporation, Osaka (JP)

(72) Inventor: Hiroki Miyajima, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 42 days.

(21) Appl. No.: 13/959,744

(22) Filed: Aug. 6, 2013

(65) Prior Publication Data

US 2013/0320562 A1 Dec. 5, 2013

Related U.S. Application Data

(63) Continuation of application No. PCT/JP2012/007841, filed on Dec. 7, 2012.

(30) Foreign Application Priority Data

Apr. 26, 2012 (JP) .................................. 2012-101097

(51) Int. Cl.
*H01L 21/70* (2006.01)
*H01L 23/48* (2006.01)
(Continued)

(52) U.S. Cl.
CPC ............. *H01L 23/481* (2013.01); *H01L 21/764* (2013.01); *H01L 2224/0557* (2013.01);
(Continued)

(58) Field of Classification Search
CPC ..... H01L 21/768; H01L 23/48; H01L 23/481; H01L 21/764; H01L 29/4991
USPC .......... 257/510, 621, 774, E23.011, E21.586, 257/330, 374; 438/675, 42, 421, 429, 629, 438/637

See application file for complete search history.

(56) References Cited

U.S. PATENT DOCUMENTS

2008/0174017 A1* 7/2008 Yang et al. ..................... 257/751
2009/0321796 A1 12/2009 Inohara
(Continued)

FOREIGN PATENT DOCUMENTS

EP 2408006 1/2012
JP 11-163228 6/1999
(Continued)

OTHER PUBLICATIONS

Japanese version of International Search Report of PCT Application No. PCT/JP2012/007841 dated Mar. 5, 2013.
(Continued)

*Primary Examiner* — Jarrett Stark
*Assistant Examiner* — Shahed Ahmed
(74) *Attorney, Agent, or Firm* — Panasonic Patent Center

(57) ABSTRACT

The present invention aims to relax stress induced by through-silicon via formed on semiconductor substrate in order to prevent property fluctuation of a transistor. A semiconductor device includes a semiconductor substrate, a through-silicon via formed in semiconductor substrate, an insulating film formed between the semiconductor substrate and the through-silicon via, and a transistor formed on the semiconductor substrate so as to be apart from the through-silicon via with a predetermined distance. The insulating film does not exist on a region close to a surface of the semiconductor substrate between the semiconductor substrate and the through-silicon via. A gap is formed to be surrounded by the semiconductor substrate, the through silicon via, and the insulating film under the region close to the surface of the semiconductor substrate.

7 Claims, 9 Drawing Sheets

(51) Int. Cl.
*H01L 21/768* (2006.01)
*H01L 21/764* (2006.01)

(52) U.S. Cl.
CPC . *H01L2224/13025* (2013.01); *H01L 21/76898* (2013.01); *H01L 21/7682* (2013.01); *H01L 2924/00014* (2013.01); *H01L 2224/0401* (2013.01)

(56) References Cited

U.S. PATENT DOCUMENTS

| | | | |
|---|---|---|---|
| 2010/0133699 A1* | 6/2010 | Werner et al. | 257/774 |
| 2010/0164117 A1* | 7/2010 | Chen | 257/774 |
| 2010/0289140 A1 | 11/2010 | Sunohara et al. | |
| 2011/0241185 A1* | 10/2011 | Koester et al. | 257/659 |
| 2012/0013022 A1 | 1/2012 | Sabuncuoglu Tezcan et al. | 257/774 |
| 2012/0153500 A1* | 6/2012 | Kim et al. | 257/774 |
| 2012/0205806 A1* | 8/2012 | Yelehanka et al. | 257/751 |
| 2012/0292782 A1* | 11/2012 | Lee et al. | 257/774 |
| 2013/0032945 A1* | 2/2013 | Lin et al. | 257/774 |
| 2013/0115769 A1* | 5/2013 | Yu et al. | 438/667 |
| 2013/0119521 A1* | 5/2013 | Chen | 257/621 |
| 2013/0224909 A1* | 8/2013 | Wu et al. | 438/106 |

FOREIGN PATENT DOCUMENTS

| | | |
|---|---|---|
| JP | 2002-289623 | 10/2002 |
| JP | 2008-053430 | 3/2008 |
| JP | 2008-085126 | 4/2008 |
| JP | 2008-251721 | 10/2008 |
| JP | 2010-010324 | 1/2010 |
| JP | 2010-135348 | 6/2010 |
| JP | 2010-267805 | 11/2010 |

OTHER PUBLICATIONS

A. Mercha et al. "Comprehensive analysis of the impact of single and arrays of through silicon vias induced stress on high-k / metal gate CMOS performance", IEDM, 2010.

* cited by examiner

SEMICONDUCTOR DEVICE

BACKGROUND

1. Technical Field

The present invention relates to a semiconductor device, and a method of manufacturing the same, and more particularly to a three-dimensional stacked semiconductor device having a through-silicon via, and a method of manufacturing the same.

2. Background Art

As an electronic device has a variety of functions and high performance in recent years, various developments have been made to realize a high-performance and highly integrated semiconductor device used for such an electronic device. Especially, a technique of three-dimensionally stacking semiconductor chips having a through-silicon via has been proposed, and this technique has been developed more actively. In the three-dimensional stacking technique, a through-silicon via penetrating through a semiconductor substrate and a bump connected to the through-silicon via are formed on one semiconductor chip, which is to be stacked, while a bump is also formed on the other semiconductor chip that is to be stacked. The chips are stacked by bonding both bumps.

FIG. 8A is a sectional view illustrating a stacked chip having a through-silicon via for a conventional three-dimensional stacking technique. FIGS. 8B, 9A, and 9B are sectional views illustrating a method of forming a stacked chip including a through-silicon via for a conventional three-dimensional stacking technique.

FIG. 8A illustrates a sectional view after a memory chip and a logic chip having a through-silicon via are stacked. The stacked semiconductor device includes memory chip 23, logic chip 24, through-silicon via 25, microbump 26, and filling material 27 between chips.

The sectional view illustrating a process of manufacturing the chip involved with the through-silicon via and its surrounding region is illustrated next.

As illustrated in FIG. 8B, elements (not illustrated) such as a transistor or a resistor are formed on semiconductor substrate 11, first interlayer insulating film 12 made of a silicon oxide film and including the elements and a wiring layer is formed, and then, contact plug 13 is formed in first interlayer insulating film 12.

Next, as illustrated in FIG. 9A, through-silicon via hole 14 penetrating through first interlayer insulating film 12 and semiconductor substrate 11 is formed by using a lithography technique and a dry etching technique. FIG. 9A illustrates that through-silicon via 14 does not reach a back surface of the semiconductor substrate. Thereafter, insulating film 15 such as a silicon oxide film is formed on first interlayer insulating film 12 along an inner wall face of through-silicon via hole 14, and then, a tantalum (Ta) film, for example, is formed as barrier film 16 that becomes a diffusion barrier of copper (Cu) that is a embedding material. Next, copper is filled in through-silicon via 14 as conductive film 17 for embedding the through-silicon via by using a plating technique, and then, an annealing process is carried out.

Next, as illustrated in FIG. 9B, conductive film 17 for embedding the through-silicon via, barrier film 16, and insulating film 15 that remain on first interlayer insulating film 12 on semiconductor substrate 11 are removed by using a CMP (Chemical Mechanical Polishing) technique, in order to form through-silicon via 18. A diameter of through-silicon via 18 generally ranges from several μm to a few dozen μm, and a depth thereof generally ranges from a few dozen μm to a few hundred μm. Finally, a bottom surface of semiconductor substrate 11 is etched or polished to expose the back surface of through-silicon via 18, and a bump connected to through-silicon via 18 is formed, although this process is not illustrated.

When the annealing process is carried out after through-silicon via 18 is formed, thick copper in through-silicon via 18 expands and contracts by the annealing process. In this case, stress is generated on semiconductor substrate 11 due to a difference in a thermal expansion coefficient between copper and silicon forming semiconductor substrate 11, so that a problem that the stress varies a performance of a transistor close to through-silicon via 18 might arise (e.g., see A. Mercha et al., Comprehensive Analysis of the Impact of Single and Arrays of Through Silicon Vias Induced stress on High-k/Metal Gate CMOS performance, IEDM, 2010).

Some proposals have been conventionally made in order to relax the stress caused by the through-silicon via. For example, there is a method (e.g., see Unexamined Japanese Patent Publication No. 11-163228) of forming a new layer between a metal in a through-silicon via and a semiconductor substrate for relaxing stress, as a method of relaxing stress to the semiconductor substrate due to the metal in the through-silicon via. There is another method (for example, see Unexamined Japanese Patent Publication No. 2008-085126) in which a metal in a through-silicon via is formed in two or more layers, and a heat treatment for relaxing stress is carried out after at least the first layer close to the semiconductor substrate is formed.

SUMMARY

However, the methods of relaxing stress described above need an additional process of forming a relaxation layer or a metal layer, and this entails problems of a limitation in performance of a material to be added and complicated process. Therefore, a more simple method of relaxing stress has been demanded.

The present invention is accomplished in view of the problems in the conventional technique, and aims to provide a highly reliable semiconductor device that relaxes stress to a semiconductor substrate induced by a through-silicon via in order to prevent property fluctuation of a transistor provided close to the through-silicon via, and a method of manufacturing the same.

In order to solve the above-described problems, the semiconductor device according to the present invention includes a semiconductor substrate, a through-silicon via formed in the semiconductor substrate, an insulating film formed to be interposed between the semiconductor substrate and the through-silicon via, and a transistor formed on the semiconductor substrate so as to be apart from the through-silicon via with a predetermined distance. The insulating film does not exist on a region close to a surface of the semiconductor substrate between the semiconductor substrate and the through-silicon via. A gap is formed to be surrounded by the semiconductor substrate, the through silicon via, and the insulating film under the region close to the surface of the semiconductor substrate.

It is preferable in the semiconductor device according to the present invention that the through-silicon via is formed to penetrate through a first interlayer insulating film formed on the semiconductor substrate, and the gap is also formed in the first interlayer insulating film.

It is preferable in the semiconductor device according to the present invention that the predetermined distance and a depth of the gap from the surface of the semiconductor substrate are substantially equal to each other.

It is preferable in the semiconductor device according to the present invention that a second interlayer insulating film is further formed on the through-silicon via, and a part of the gap is embedded with the second interlayer insulating film.

It is preferable in the semiconductor device according to the present invention that the insulating film is made of a silicon nitride film.

It is preferable in the semiconductor device according to the present invention that a stress liner film applying stress to the transistor is formed on the semiconductor substrate excluding a region on the through-silicon via and its surrounding region.

It is preferable in the semiconductor device according to the present invention that the through-silicon via includes an outside barrier film and an inside conductive film.

A method of manufacturing a semiconductor device according to the present invention includes a step (a) of forming a first interlayer insulating film including a transistor on a semiconductor substrate; a step (b) of forming a through-hole in the first interlayer insulating film and in the semiconductor substrate so as to be apart from the transistor with a predetermined distance; and a step (c) of forming an insulating film on an inner wall face of the through-hole. The method further includes a step (d) of forming a through-silicon via by embedding a conductive film in the through-hole after the step (c); and a step (e) of carrying out an annealing process to the semiconductor substrate after the step (d). The method also includes a step (f) of forming a gap between the semiconductor substrate and the through-silicon via on a region close to a surface of the semiconductor substrate by removing an upper part of the insulating film interposed between the first interlayer insulating film as well as the semiconductor substrate and the through-silicon via.

It is preferable in the method of manufacturing a semiconductor device according to the present invention that the upper part of the insulating film is removed in order to allow the predetermined distance and a depth of the gap from the surface of the semiconductor substrate to be substantially equal to each other in the step (f).

It is preferable that the method of manufacturing a semiconductor device according to the present invention further includes a step (g) of forming a second interlayer insulating film on a region on the first interlayer insulating film including a region on the through-silicon via after the step (f), wherein the second interlayer insulating film is embedded in a part of the gap in the step (g).

It is preferable that the method of manufacturing a semiconductor device according to the present invention further includes, between the step (a) and the step (b), a step (i) of forming a stress liner film that applies stress to the transistor, and a step (j) of removing the stress liner film on a region on the through-silicon via and its surrounding region.

It is preferable in the method of manufacturing a semiconductor device according to the present invention that the insulating film is made of a silicon nitride film.

It is preferable in the method of manufacturing a semiconductor device according to the present invention that the through-silicon via includes an outside barrier film and an inside conductive film.

According to the semiconductor device and the method of manufacturing a semiconductor device of the present invention, stress is released on the semiconductor substrate by the gap formed between the through-silicon via and the substrate, whereby the stress to the semiconductor substrate induced by the through-silicon via can be relaxed, and the property fluctuation of the transistor provided close to the through-silicon via can be prevented. Consequently, the present invention can provide a highly-reliable semiconductor device.

DESCRIPTION OF EXEMPLARY EMBODIMENTS

Exemplary embodiments of the present invention will be described in detail below with reference to the drawings. In the exemplary embodiments of the present invention, a formation of a through-silicon via by a via-middle process is supposed. However, the present invention is not limited thereto.

First Exemplary Embodiment

A first exemplary embodiment of the present invention will be described below with reference to the drawings.

FIGS. 1A to 3 are sectional views illustrating a process of a method of manufacturing a semiconductor device according to a first exemplary embodiment of the present invention.

Figure 1A:
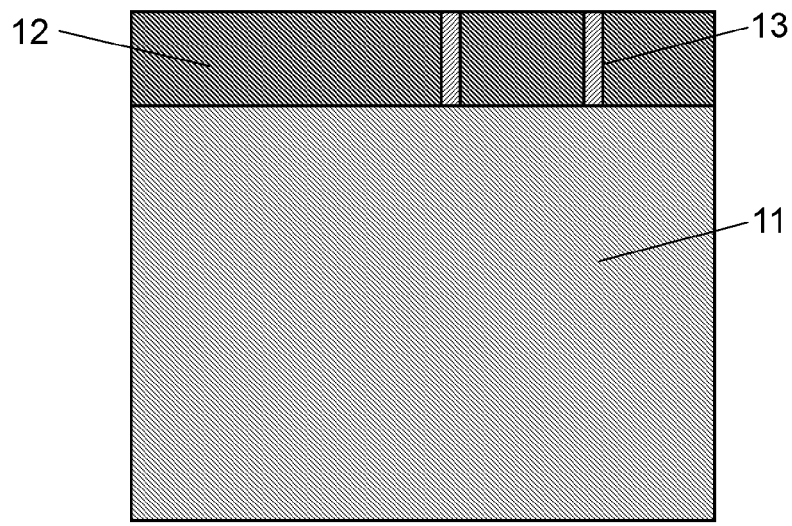
FIG. 1A is a sectional view illustrating a process of a method of manufacturing a semiconductor device according to a first exemplary embodiment of the present invention.

As illustrated in FIG. 1A, elements (not illustrated) such as a transistor or a resistor are formed on semiconductor substrate 11, first interlayer insulating film 12 made of a silicon oxide film and including the elements and a wiring layer is formed, and then, contact plug 13 is formed in first interlayer insulating film 12. In this case, a thickness of first interlayer insulating film 12 is 500 nm, for example.

Figure 1B:
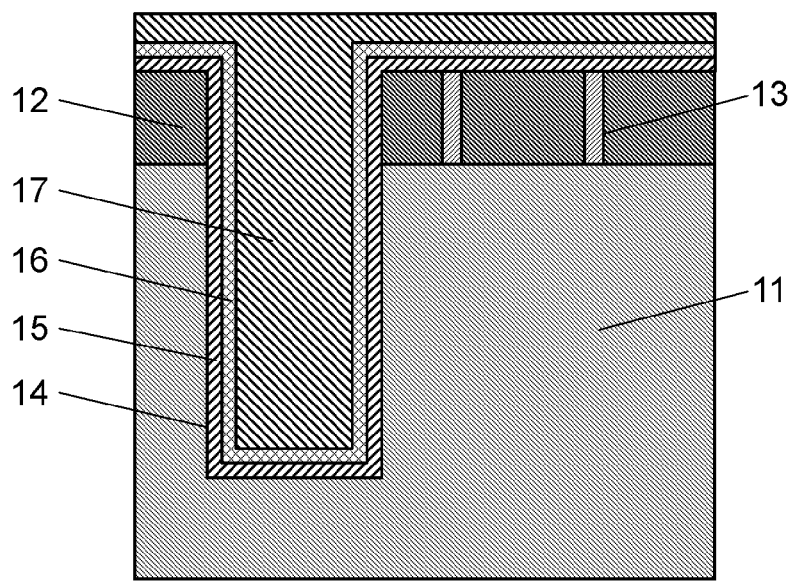
FIG. 1B is a sectional view illustrating a process of the method of manufacturing a semiconductor device according to the first exemplary embodiment of the present invention.

Next, as illustrated in FIG. 1B, through-silicon via hole 14 having a diameter of 5 μm and a depth of 50 μm is formed by using a lithography technique and a dry etching technique, and then, insulating film 15 made of a silicon nitride film having a thickness of 200 nm is formed, for example. Thereafter, barrier film 16 made of a tantalum (Ta) film having a thickness of 20 nm is formed, for example. Next, copper is filled in through-silicon via hole 14 as conductive film 17 for embedding the through-silicon via by using a plating technique, and then, an annealing process is carried out.

Figure 2A:
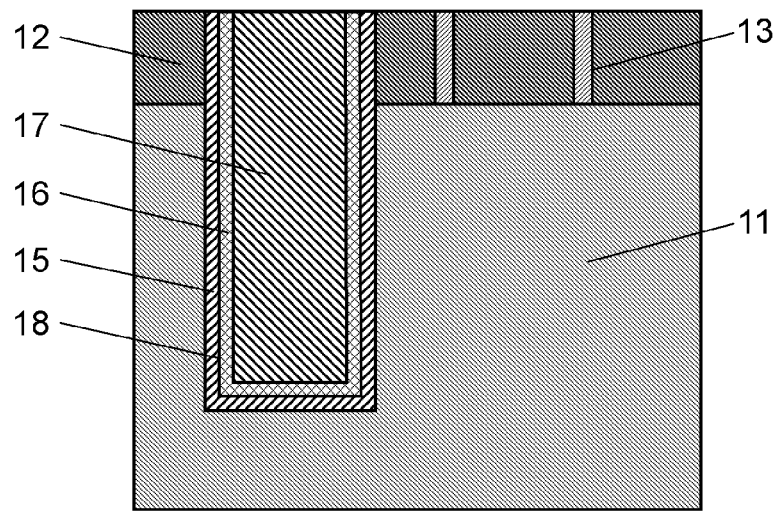
FIG. 2A is a sectional view illustrating a process of the method of manufacturing a semiconductor device according to the first exemplary embodiment of the present invention.

Next, as illustrated in FIG. 2A, conductive film 17 for embedding the through-silicon via, barrier film 16, and insulating film 15 that remain on first interlayer insulating film 12 on semiconductor substrate 11 are removed by using a CMP (Chemical Mechanical Polishing) technique, in order to form through-silicon via 18. When silicon is used as a material for semiconductor substrate 11, a thermal expansion coefficient of silicon is about 3 ppm/° C., and a thermal expansion coefficient of copper (Cu) of the through-silicon via is about 17 ppm/° C. Therefore, stress is generated on semiconductor substrate 11 during the annealing process or cooling process due to mismatch in the thermal expansion coefficient between both of them.

Figure 2B:
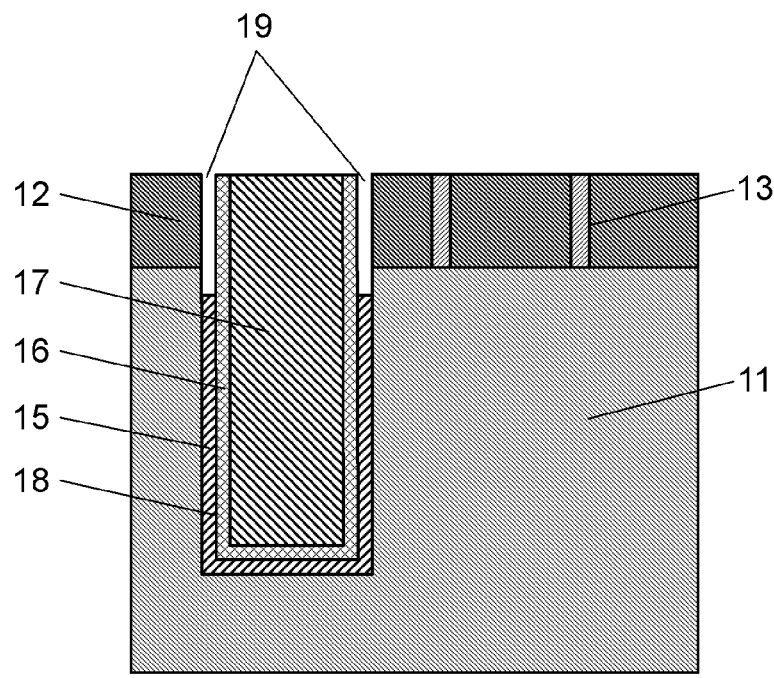
FIG. 2B is a sectional view illustrating a process of the method of manufacturing a semiconductor device according to the first exemplary embodiment of the present invention.

Next, as illustrated in FIG. 2B, insulating film 15 made of the silicon nitride film and formed between conductive film 17 of through-silicon via 18 and surrounding first interlayer insulating film 12 as well as surrounding semiconductor substrate 11 is removed by a wet etching to a depth of 500 nm from the surface of semiconductor substrate 11, for example. Thus, gap 19 is formed between a side face of through-silicon via 18 and surrounding semiconductor substrate 11. The wet etching is carried out by using hot phosphoric acid. The wet etching is carried out to first interlayer insulating film 12 made of the silicon oxide film in order that only the silicon nitride film is selectively etched. In this case, the stress generated by insulating film 15 made of the silicon nitride film is released by the formation of gap 19.

Figure 4:
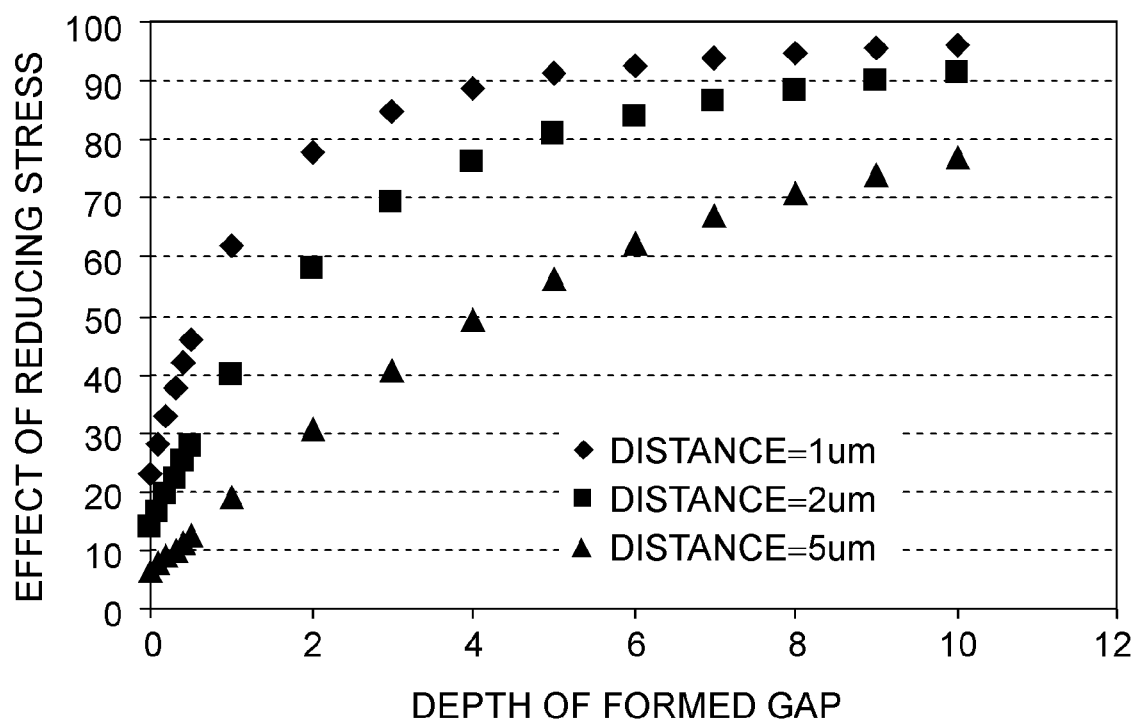
FIG. 4 is a graph illustrating a relationship between a depth of a formed gap and an effect of reducing stress from a through-silicon via in a semiconductor device according to the first exemplary embodiment of the present invention.

FIG. 4 is a graph illustrating a relationship between the depth of the formed gap from semiconductor substrate 11 and an effect of reducing stress from the through-silicon via (1−stress during formation of gap/stress when gap is not formed×100). FIG. 4 illustrates the effect of reducing stress on the transistors mounted on positions of 1, 2, and 5 μm from the through-silicon via respectively.

For example, in the case of the transistor located on the position apart from the through-silicon via by 2 μm, the effect of reducing stress of about 60% is attained, if the depth of the formed gap is set to be 2 μm.

Figure 3:
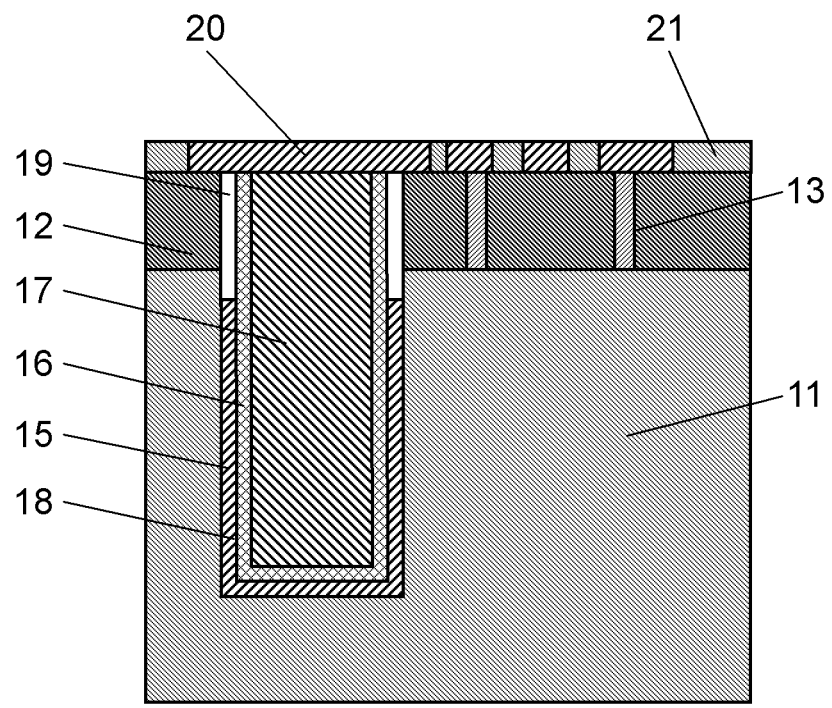
FIG. 3 is a sectional view illustrating a process of the method of manufacturing a semiconductor device according to the first exemplary embodiment of the present invention.

Subsequently, as illustrated in FIG. 3, first wiring layer 20 and second interlayer insulating film 21 filling the surroundings of first wiring layer 20 are formed on through-silicon via 18 in first interlayer insulating film 12. In this case, gap 19 may locally be filled with first wiring layer 20. Finally, a bottom surface of semiconductor substrate 11 is etched or polished to expose the back surface of through-silicon via 18, and a bump connected to through-silicon via 18 is formed, although this process is not illustrated.

According to the configuration of the present exemplary embodiment, stress is released on the semiconductor substrate by the gap formed between the through-silicon via and the substrate, whereby the stress to the semiconductor substrate induced by the through-silicon via can be relaxed, and the property fluctuation of the transistor provided close to the through-silicon via can be prevented.

In the present exemplary embodiment, after contact plug 13 is formed on first interlayer insulating film 12, through-silicon via 18 is formed, and then, gap 19 is formed to relax the stress. However, the present invention is not limited to this process. It may be configured such that, after plural wiring layers are formed, through-silicon via 18 is formed, and then, gap 19 is formed to relax the stress.

In the present exemplary embodiment, gap 19 is left after through-silicon via 18 is formed. However, if the stress is temporarily released by the formation of gap 19 between the side face of the through-silicon via and surrounding semiconductor substrate 11 after the annealing process, the property fluctuation of the element due to the stress can be prevented. Therefore, after the stress is temporarily released, another insulating material may be embedded in a part of gap 19.

Second Exemplary Embodiment

A second exemplary embodiment of the present invention will be described below with reference to the drawings.

FIGS. 5A to 7 are sectional views illustrating a process of a method of manufacturing a semiconductor device according to a second exemplary embodiment of the present invention.

Figure 5A:
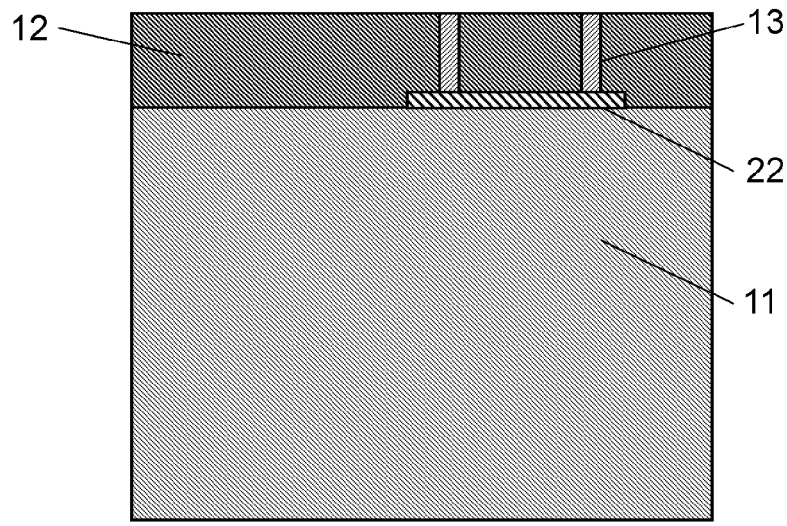
FIG. 5A is a sectional view illustrating a process of a method of manufacturing a semiconductor device according to a second exemplary embodiment of the present invention.

As illustrated in FIG. 5A, elements (not illustrated) such as a transistor or a resistor are formed on semiconductor substrate 11, first interlayer insulating film 12 made of a silicon oxide film and including the elements and a wiring layer is formed, and then, contact plug 13 is formed in first interlayer insulating film 12. In this case, a thickness of first interlayer insulating film 12 is 500 nm, for example. In the present exemplary embodiment, stress liner film 22, which is mainly made of a silicon nitride film for applying stress to a channel of a transistor in order to enhance driving force, is formed in first interlayer insulating film on a position close to semiconductor substrate 11.

Stress liner film 22 formed on the region where through-silicon via 18 is formed by another process and its surrounding region is preliminarily removed by the lithography technique and the etching technique. When the present exemplary embodiment is applied to a dual stress liner film process for separately creating a stress liner film on a region where an Nch transistor is formed and a region where a Pch transistor is formed, the liner film formed on the region where through-silicon via 18 is formed and its surrounding region can simultaneously be removed upon forming the region where the Nch transistor is to be formed and the region where the Pch transistor is to be formed. Accordingly, the increase in the number of processes can be prevented.

Figure 5B:
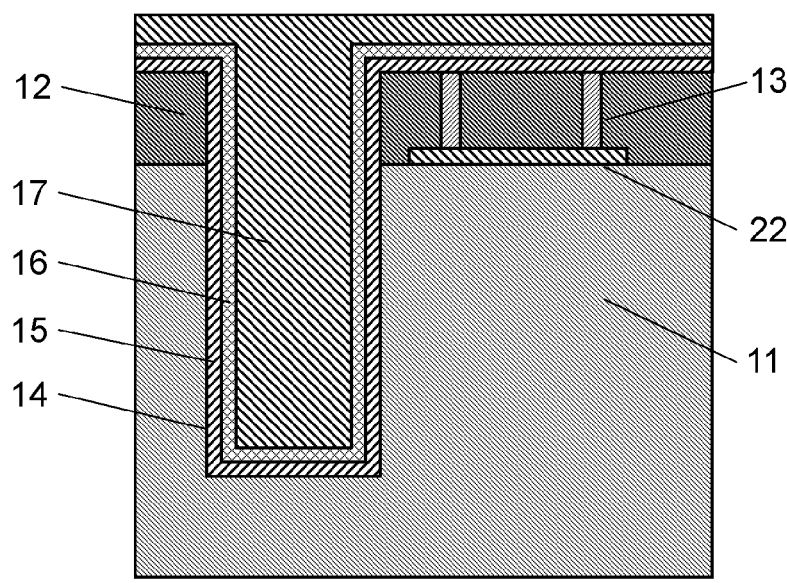
FIG. 5B is a sectional view illustrating a process of the method of manufacturing a semiconductor device according to the second exemplary embodiment of the present invention.

Next, as illustrated in FIG. 5B, through-silicon via hole 14 having a diameter of 5 μm and a depth of 50 μm is formed by using a lithography technique and a dry etching technique, and then, insulating film 15 made of a silicon nitride film having a thickness of 200 nm is formed, for example. Thereafter, barrier film 16 made of a tantalum (Ta) film having a thickness of 20 nm is formed, for example. Next, copper is filled in through-silicon via hole 14 as conductive film 17 for embedding the through-silicon via by using a plating technique, and then, an annealing process is carried out.

Figure 6A:
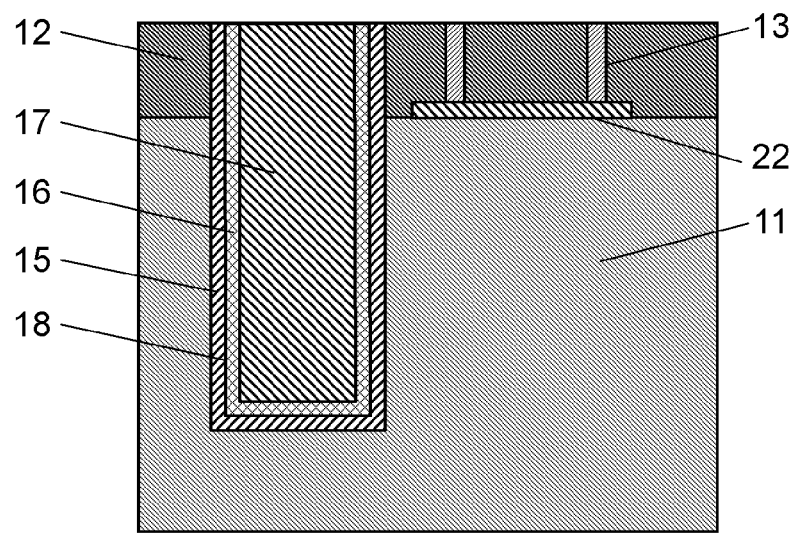
FIG. 6A is a sectional view illustrating a process of the method of manufacturing a semiconductor device according to the second exemplary embodiment of the present invention.

Next, as illustrated in FIG. 6A, conductive film 17 for embedding the through-silicon via, barrier film 16, and insulating film 15 that remain on first interlayer insulating film 12 on semiconductor substrate 11 are removed by using a CMP technique, in order to form through-silicon via 18. When silicon is used as a material for semiconductor substrate 11, a thermal expansion coefficient of silicon is about 3 ppm/° C., and a thermal expansion coefficient of copper (Cu) of the through-silicon via is about 17 ppm/° C. Therefore, stress is generated on semiconductor substrate 11 during the annealing process or cooling process due to mismatch in the thermal expansion coefficient between both of them.

Figure 6B:
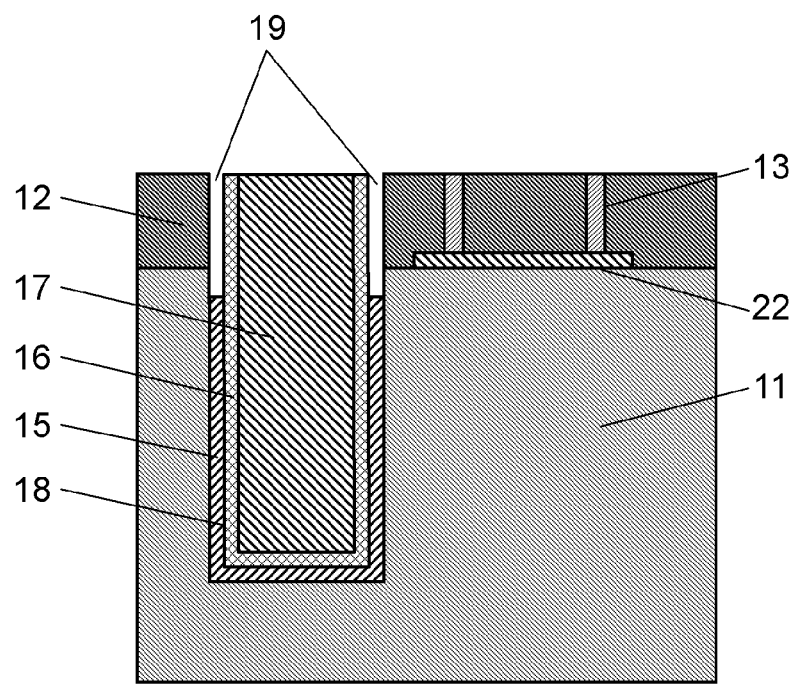
FIG. 6B is a sectional view illustrating a process of the method of manufacturing a semiconductor device according to the second exemplary embodiment of the present invention.

Next, as illustrated in FIG. 6B, insulating film 15 made of the silicon nitride film and formed between conductive film 17 of through-silicon via 18 and surrounding first interlayer insulating film 12 as well as surrounding semiconductor substrate 11 is removed by a wet etching to a depth of 500 nm from the surface of semiconductor substrate 11, for example. Thus, gap 19 is formed between a side face of the through-silicon via and surrounding semiconductor substrate 11. The wet etching is carried out by using hot phosphoric acid. The wet etching is carried out to first interlayer insulating film 12 made of the silicon oxide film in order that only the silicon nitride film is selectively etched. In this case, the stress generated by insulating film 15 made of the silicon nitride film is released by the formation of gap 19.

In the present exemplary embodiment, stress liner film 22 formed on the region where through-silicon via 18 is formed by another process and its surrounding region is preliminarily removed by the lithography technique and the etching technique. Therefore, there is no chance that stress liner film 22 on the region needed to apply stress to the transistor is etched. Accordingly, only insulating film 15, made of the silicon nitride film, between the side face of through-silicon via 18 and its surrounding semiconductor substrate 11 can selectively be removed by the wet etching.

Figure 7:
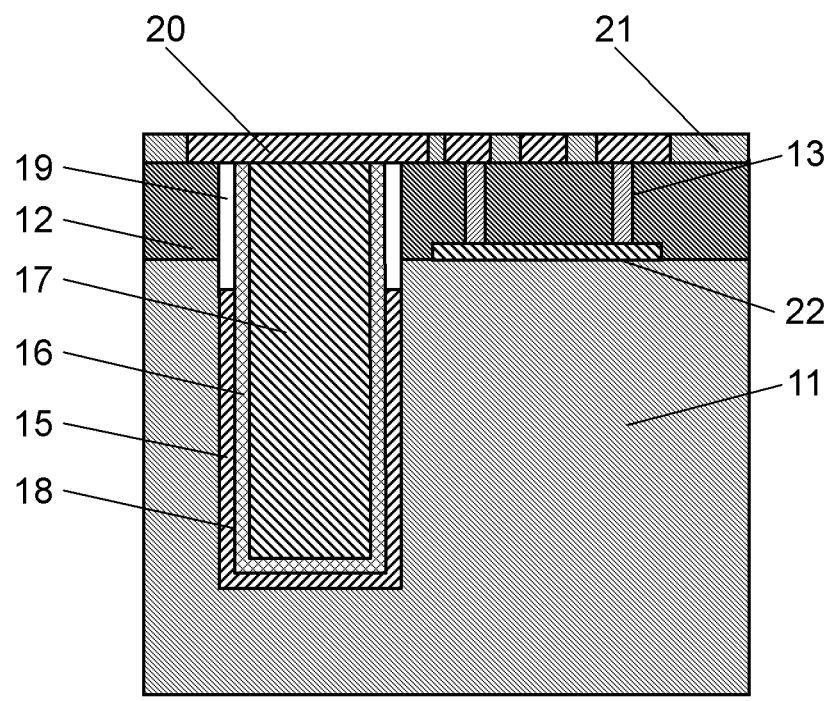
FIG. 7 is a sectional view illustrating a process of the method of manufacturing a semiconductor device according to the second exemplary embodiment of the present invention.
Figure 8A:
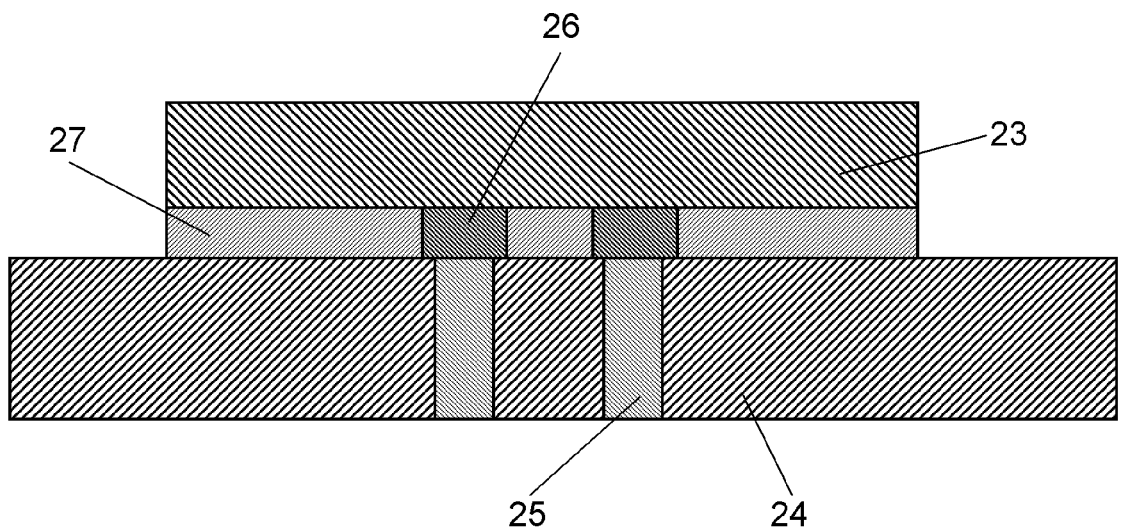
FIG. 8A is a sectional view illustrating a conventional semiconductor device.
Figure 8B:
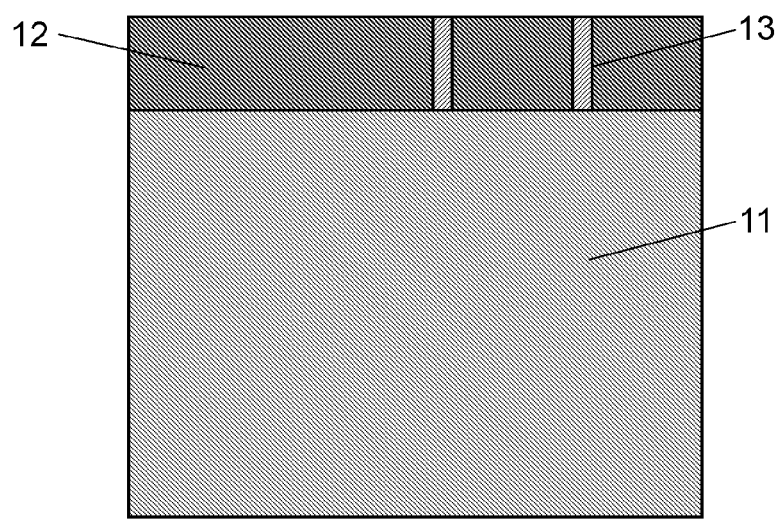
FIG. 8B is a sectional view illustrating a process of a conventional method of forming a through-silicon via.
Figure 9A:
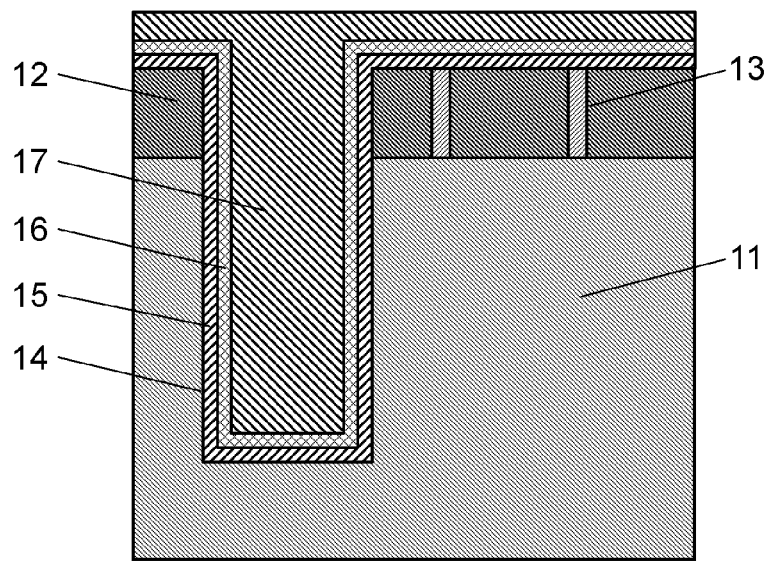
FIG. 9A is a sectional view illustrating a process of a conventional method of forming a through-silicon via.
Figure 9B:
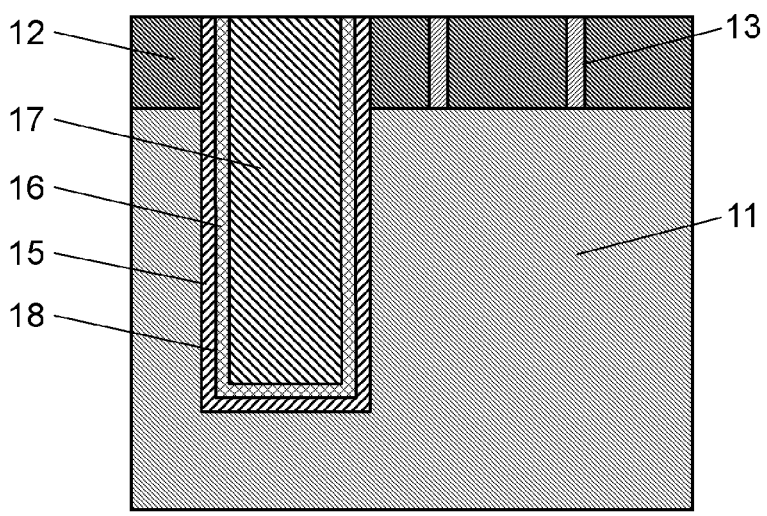
FIG. 9B is a sectional view illustrating a process of the conventional method of forming the through-silicon via.

Subsequently, as illustrated in FIG. 7, first wiring layer 20 and second interlayer insulating film 21 filling the surroundings of first wiring layer 20 are formed on through-silicon via 18 in first interlayer insulating film 12. In this case, gap 19 may locally be filled with first wiring layer 20. Finally, a bottom surface of semiconductor substrate 11 is etched or polished to expose the back surface of through-silicon via 18, and a bump connected to through-silicon via 18 is formed, although this process is not illustrated.

According to the configuration of the present exemplary embodiment, stress is released on the semiconductor substrate by the gap formed between the through-silicon via and the substrate, whereby the stress to the semiconductor substrate induced by the through-silicon via can be relaxed, and the property fluctuation of the transistor provided close to the through-silicon via can be prevented.

According to the configuration of the present exemplary embodiment, the stress liner film of through-silicon via 18 is selectively removed even in a semiconductor device including stress liner film 22 mainly made of the silicon nitride film. Accordingly, only insulating film 15, made of the silicon nitride film, between the side face of through-silicon via 18 and its surrounding semiconductor substrate 11 can selectively be removed by a wet etching without giving damage to stress liner film 22 on the region required to apply stress to the transistor.

In the present exemplary embodiment, after contact plug 13 is formed on first interlayer insulating film 12, through-silicon via 18 is formed, and then, gap 19 is formed to relax the stress. However, the present invention is not limited to this process. It may be configured such that, after plural wiring layers are formed, through-silicon via 18 is formed, and then, gap 19 is formed to relax the stress.

In the present exemplary embodiment, gap 19 is left after through-silicon via 18 is formed. However, if the stress is temporarily released by the formation of gap 19 between the side face of the through-silicon via and surrounding semiconductor substrate 11 after the annealing process, the property fluctuation of the element due to the stress can be prevented. Therefore, after the stress is temporarily released, another insulating material may be embedded in a part of gap 19.

The semiconductor device and the method of manufacturing the same can relax stress to a semiconductor substrate induced by a through-silicon via in order to prevent property fluctuation of a transistor provided close to the through-silicon via. The present invention is well useful to a three-dimensional stacked semiconductor device that has a through-silicon via and that is required to have microfabrication, high integration, high performance, and enhanced yield, and to a method of manufacturing the same.

What is claimed is:

1. A semiconductor device comprising:
   a semiconductor substrate;
   a through-silicon via formed in the semiconductor substrate;
   an insulating film formed to be interposed between the semiconductor substrate and the through-silicon via; and
   a transistor formed on the semiconductor substrate so as to be apart from the through-silicon via with a predetermined distance,
   wherein the insulating film does not exist on a region close to a surface of the semiconductor substrate between the semiconductor substrate and the through-silicon via,
   a gap is formed to be directly surrounded by the semiconductor substrate, the through-silicon via, and the insulating film under the region close to the surface of the semiconductor substrate, and
   a portion of the semiconductor substrate and a portion of the through-silicon via are exposed in the gap.

2. The semiconductor device according to claim 1, wherein the through-silicon via is formed to penetrate through a first interlayer insulating film formed on the semiconductor substrate, and
   the gap is also formed in the first interlayer insulating film.

3. The semiconductor device according to claim 1, wherein the predetermined distance and a depth of the gap from the surface of the semiconductor substrate are substantially equal to each other.

4. The semiconductor device according to claim 1, further comprising:
   a second interlayer insulating film on the through-silicon via, and
   the second interlayer insulating film is embedded in a part of the gap.

5. The semiconductor device according to claim 1, wherein the insulating film is made of a silicon nitride film.

6. The semiconductor device according to claim 1, wherein a stress liner film that applies stress to the transistor is formed on the semiconductor substrate excluding a region on the through-silicon via and a surrounding region thereof.

7. The semiconductor device according to claim 1, wherein the through-silicon via includes an outside barrier film and an inside conductive film.

* * * * *